(12) United States Patent
Kalyadan et al.

(10) Patent No.: US 11,614,479 B2
(45) Date of Patent: Mar. 28, 2023

(54) INTERNAL DEVICE SEQUENCER FOR TESTING MODE

(71) Applicant: TEXAS INSTRUMENTS INCORPORATED, Dallas, TX (US)

(72) Inventors: Sandeep Kalyadan, Mattanur (IN); Krishnamurthy Ganapathi Shankar, Bangalore (IN); Venkatesh Guduri, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 17/409,633

(22) Filed: Aug. 23, 2021

(65) Prior Publication Data

US 2023/0056957 A1    Feb. 23, 2023

(51) Int. Cl.
*G01R 31/26* (2020.01)
*G01R 31/28* (2006.01)
*G01R 31/42* (2006.01)

(52) U.S. Cl.
CPC ..... *G01R 31/2827* (2013.01); *G01R 31/2621* (2013.01)

(58) Field of Classification Search
CPC .... G01R 31/02; G01R 31/26; G01R 31/2621; G01R 31/28; G01R 31/2827; G01R 31/31; G01R 31/42
See application file for complete search history.

(56) References Cited

U.S. PATENT DOCUMENTS 7,705,673 B2 * 4/2010 Teng ............... H03F 1/523
330/207 P
2011/0051296 A1 * 3/2011 Ando ............... H02H 9/025
361/18

* cited by examiner

*Primary Examiner* — Neel D Shah
(74) *Attorney, Agent, or Firm* — Valerie M. Davis; Frank D. Cimino

(57) ABSTRACT

A device includes FETs with control terminals. A gate driver circuit causes the FETs to turn on and to enter a high-impedance state in response to an OCP signal. A current sense circuit senses an FET current through the FETs and sends the OCP signal to the gate driver circuit when the FET current exceeds an OCP current for longer than an OCP deglitch period. A test sequencer, in response to receiving an external test mode signal, sets the OCP current to a preset OCP test current, sets the OCP deglitch period to a preset OCP deglitch test period, and causes the gate driver circuit to turn on the plurality of FETs.

20 Claims, 4 Drawing Sheets

INTERNAL DEVICE SEQUENCER FOR TESTING MODE

BACKGROUND

During manufacturing, electronic devices are tested for functionality. If the testing shows that the devices meet certain specifications, then the devices are released for sale. Testing is typically expedited by using specialized automated test equipment, but when devices are manufactured in large volumes, the time taken to test each device may become a factor in the number of devices that may be produced per day.

SUMMARY

In examples, a device includes a plurality of field-effect transistors (FETs), where each of the FETs has a control terminal. The device further includes a gate driver circuit coupled to the control terminal of each of the plurality of FETs. The gate driver is configured to cause the plurality of FETs to turn on and to cause the plurality of FETs to enter a high-impedance state in response to receiving an over-current protection (OCP) signal. The device also includes a current sense circuit coupled to the plurality of FETs. The current sense circuit is configured to sense an FET current passing through the plurality of FETs and to send the OCP signal to the gate driver circuit when the FET current exceeds an OCP current for a period of time longer than an OCP deglitch period. The device still further includes a test sequencer coupled to the gate driver circuit and the current sense circuit. The test sequencer is configured to, in response to receiving an external test mode signal, set the OCP current to a preset OCP test current, set the OCP deglitch period to a preset OCP deglitch test period, and cause the gate driver circuit to turn on the plurality of FETs.

In another example, a method of operating an FET device having at least one FET includes receiving an external test mode signal and, in response thereto, setting an OCP current of a current sense circuit of the FET device to a preset OCP test current, setting an OCP deglitch period of the current sense circuit to a preset OCP deglitch test period, and causing a gate driver circuit of the FET device to turn on one or more FETs of the FET device.

BRIEF DESCRIPTION OF THE DRAWINGS

For a detailed description of various examples, reference will now be made to the accompanying drawings in which.

The same reference numbers or other reference designators are used in the drawings to designate the same or similar (functionally and/or structurally) features.

DETAILED DESCRIPTION

FETs and metal oxide semiconductor field effect transistors (MOSFETs) are used widely in electrical and electronic devices. FETs may be used in applications such as as analog switches, amplifiers, and phase shift oscillators. MOSFETs and power MOSFETs may be used in applications such as motor and solenoid drivers, switching power supplies and power inverters, and radio systems.

The time taken to test an FET device depends on several factors. One factor is the automated testing equipment used to perform the tests. Some testing equipment performs tests more quickly than others, but such faster testing equipment may be more expensive than slower testing equipment. Another factor is the number of tests to be performed on the FET device. For some device applications, more tests are performed to confirm some FET device functions. For applications where more functions of the FET device are tested, the testing process will likely take longer than the testing process for applications that call for testing fewer functions of the device.

In accordance with various examples, an FET device includes an internal sequencer that alters some device parameters to allow accurate testing of a plurality of device functions during a single test period, providing a shorter overall testing time for the device, when compared to devices where each device function is tested in a separate test period.

Figure 1:
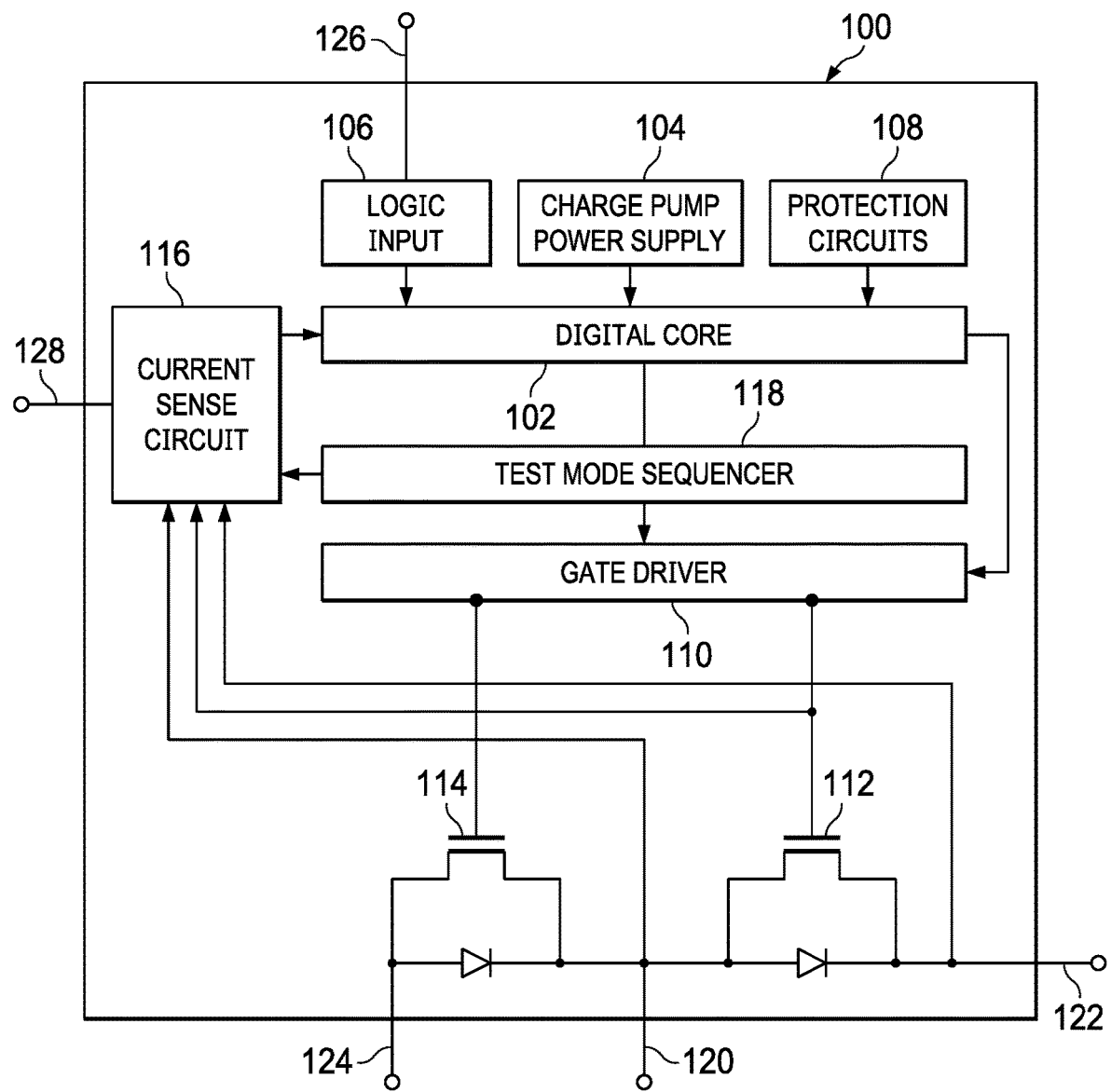
FIG. 1 is a block diagram of an FET device in accordance with various examples.

FIG. 1 is a block diagram of an FET device 100 in accordance with various examples. The FET device 100 includes a digital core 102, a charge pump power supply 104, a logic input circuit 106, protection circuits 108, a gate driver circuit 110, FETs 112 and 114, a current sense circuit 116, and a test mode sequencer 118. The digital core 102 is a digital logic block that receives digital input signals via the logic input circuit 106 from devices external to the FET device 100. In operation, digital core 102 turns the FETs 112 and 114 on and off via the gate driver circuit 110. The protection circuits 108 monitor conditions such as over current, low or high supply voltage to the FETs 112 and 114, and drain-to-source short circuits in the FETs 112 and 114, in order to protect the FET device 100 from damage. The current sense circuit 116 provides over-current protection (OCP) for the FETs 112 and 114 by sensing current through the FET 112 (and/or FET 114 in some example embodiments) and signaling an over current condition when the sensed current exceeds an OCP threshold value for a period of time longer than an OCP deglitch period. The charge pump power supply 104 provides power for the circuits of the FET device 100, including gate power for the gate driver circuit 110.

The current sense circuit 116 is coupled to the source, gate, and drain terminals of the FET 112 to sense current through the FET 112 (which also indicates the current through the FET 114). In some examples, the current through the FET 112 is sensed using a current-sharing MOSFET, (e.g., a Sense FET). When the sensed current exceeds the OCP threshold value for a period of time longer than the OCP deglitch period, the current sense circuit 116 signals an OCP state to the digital core 102, which responds by causing the gate driver circuit 110 to put the FETs 112 and 114 in a protective high-impedance state (or Hi-Z state). In some examples, current sense circuit 116 may be coupled to the source, gate and/or drain of FET 112 and/or FET 114.

The FET device 100 further includes a pin 124 (GND) that is coupled to the source of the FET 114. A digital input pin 126 is coupled to the logic input circuit 106 and configured to receive a test mode signal from an external device. The current sense circuit 116 generates a current or signal (referred to as IPROPI) on an IPROPI output pin 128 that is proportional to the current through the FET 112.

In response to receiving the test mode signal on the digital input pin 126, the digital core 102 causes the test mode sequencer 118 to enter a testing mode. In some examples, the test mode signal exceeds a preset test mode threshold value. In some such examples, the test mode signal is a 7 volt signal (approximately) on a logic pin that receives a 0-5 volt signal in normal operation. In other examples, the test mode signal may have one or more other characteristics selected by a designer of the FET device 100 to reduce a likelihood that the FET device 100 will receive the test mode signal when installed in a user device other than a testing device.

In the testing mode, the test mode sequencer 118 is configured to cause the current sense circuit 116 to set the OCP current to a preset OCP test current and to set the OCP deglitch period to a preset OCP deglitch test period. The test mode sequencer 118 is further configured to cause the gate driver circuit 110 to turn on the FETs 112 and 114. The preset OCP test current is a value that is less than an OCP current used in normal (or 'non-test mode') operation. The preset OCP deglitch test period is a value that results in a longer deglitch period than an OCP deglitch period used in non-test mode operation.

Figure 2:
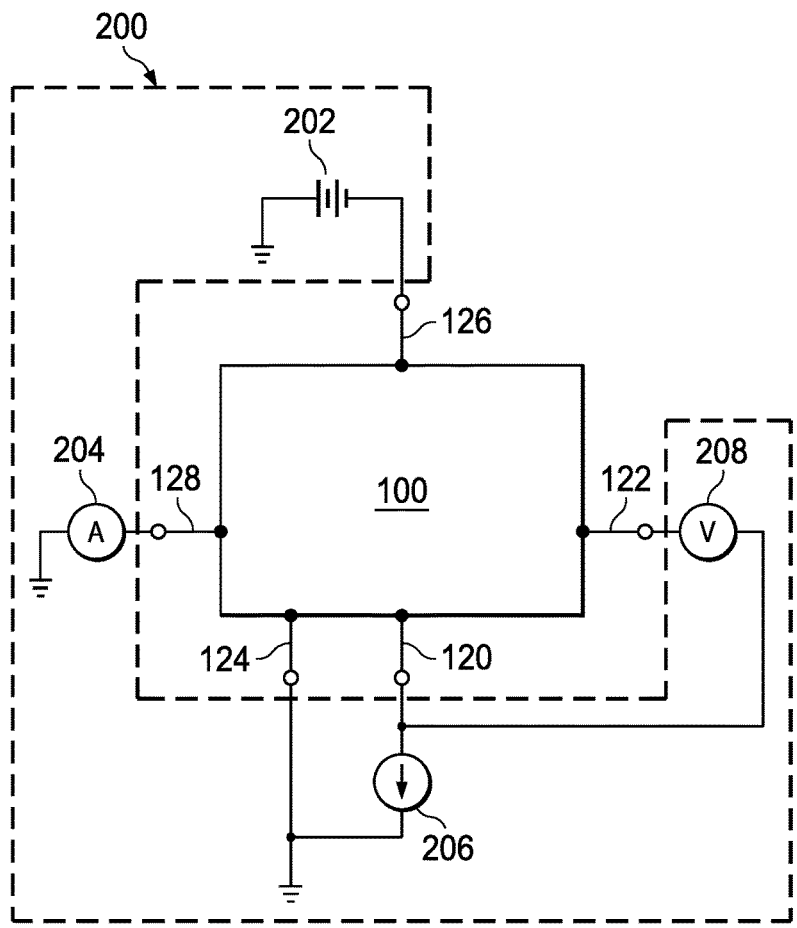
FIG. 2 is a block diagram of an FET device in accordance with various examples coupled to a test system.

FIG. 2 is a block diagram of the FET device 100 coupled to a test system 200. The test system 200 includes a voltage source 202 coupled to the digital input pin 126 to provide the test mode signal to the FET device 100 as described above. The test system 200 also includes an ammeter 204 coupled to the IPROPI output pin 128 to read the IPROPI signal from the FET device 100. The test system 200 further includes a controllable current source 206 coupled to the OUT pin 120 and to the GND pin 124. The controllable current source 206 is said to 'sink' current from the OUT pin 120, because current flows from the OUT pin 120 to the GND pin 124. The test system 200 also couples the GND pin 124 to a ground voltage potential. The test system 200 further includes a voltmeter 208 coupled to the VM pin 122 and the OUT pin 120 to sense a voltage developed across the FET 112 by the current sinked from the OUT pin 120 by the controllable current source 206. As described above, the current sense circuit 116 determines the current through the FET 112 by sensing the voltage between the VM pin 122 and the OUT pin 120.

Figure 3:
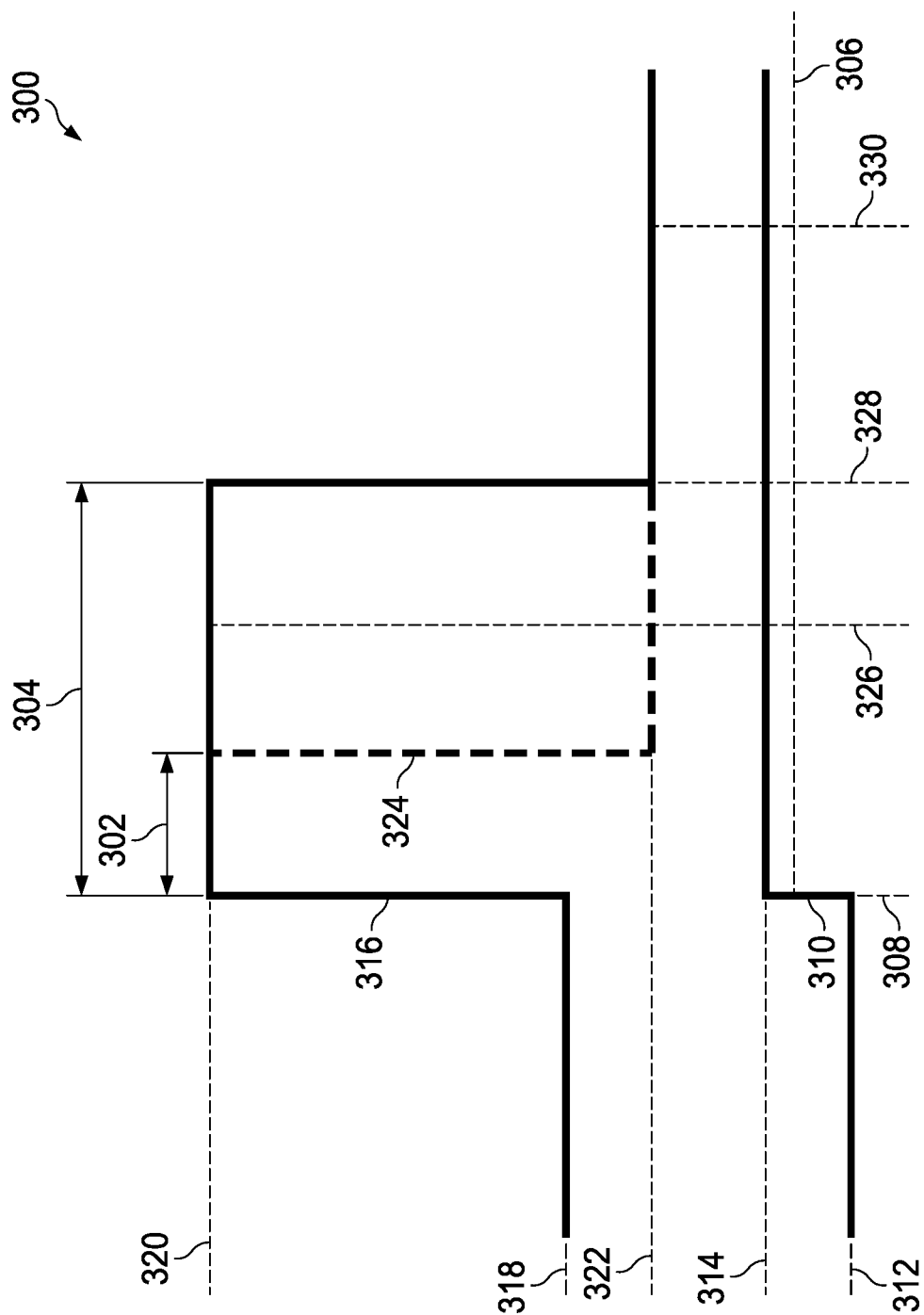
FIG. 3 shows a timing diagram for an FET device in accordance with various examples coupled in a first testing scenario.

FIG. 3 shows a timing diagram 300 for an FET device in accordance with various examples coupled in a first testing scenario. The timing diagram 300 is explained with reference to the FET device 100 coupled to a test system 200, as shown in FIG. 2. In response to the 7 volt test mode signal on the digital input pin 126 (not shown in FIG. 3), the test mode sequencer 118 causes the current sense circuit 116 to increase the OCP deglitch period from a non-test mode period 302 used in non-test mode operation to a preset OCP deglitch test period 304 and to decrease the OCP current from a value used in non-test mode operation (not shown in FIG. 3) to a preset OCP test current 306. The test mode sequencer 118 also enables the current sense circuit 116. The test mode sequencer 118 also causes the gate driver circuit 110 to turn on the FETs 112 and 114.

The preset OCP deglitch test period 304 is selected by a designer of the FET device 100 to be long enough for the test system 200 to measure drain-source resistance of the FETs 112 and 114 (as explained in more detail below). In some examples, the preset OCP deglitch test period 304 is approximately 1 millisecond and the preset OCP test current 306 is approximately 200 milliamps.

The test system 200 begins the testing sequence at time 308 by raising the current 310 sinked from the OUT pin 120 by the controllable current source 206 from a current value 312 of approximately 0 amps to a current value 314. The current value 314 is a current used by the test system 200 to measure the RDS(on) parameter of the FETs 112 and 114. RDS(on) is an acronym for "drain-source on resistance," or the total resistance between the drain and source in an FET (or plurality of FETs) when the FET is conducting (turned on).

The preset OCP test current 306 is selected by a designer of the FET device 100 to be less than the current value 314 used by the test system 200, so that, after the preset OCP deglitch test period 304 expires, the test system 200 can test for correct functioning of an OCP response of the current sense circuit 116 (as explained in more detail below). In this way, RDS(on) may be measured and OCP functionality may be tested in a single test period, providing a reduced overall testing time for the FET device 100.

When the test system 200 begins sinking the current value 314, a voltage 316 across the FET 112 (e.g., the voltage across terminals 120 and 122), as measured by the voltmeter 210, rises from a voltage value 318 of approximately 0 volts to a voltage value 320. The voltage value 320 is a product of the current value 314 and the RDS(on) value of the FETs 112 and 114.

If the OCP deglitch period were still set to its non-test mode value when the non-test mode OCP deglitch period 302 was completed, the current sense circuit 116 would trigger its OCP function, because the current value 314 is higher than the preset OCP test current 306. The OCP function would then cause the FETs 112 and 114 to be put into the Hi-Z state, dropping the voltage 316 to a voltage value 322 of approximately −0.7 volts, as shown by the dashed line 324.

However, because the test mode sequencer 118 increased the OCP deglitch period to the preset OCP deglitch test period 304, the voltage 316 remains at the voltage value 320 and, at time 326, the test system 200 measures the voltage value 320 using the voltmeter 210. From the measured voltage value 320, the test system 200 calculates an RDS (on) value for the FETs 112 and 114 to determine compliance of the FET device 100 with specifications. The value of RDS(on) is calculated by the test system 200 as the voltage value 320 divided by the current value 314.

At time 328, the preset OCP deglitch test period 304 ends and the current sense circuit 116 triggers its OCP function because the current value 314 is higher than the OCP test current 306. Triggering of the OCP function causes the FETs 112 and 114 to be put into the protective Hi-Z state, dropping the voltage 316 to the voltage value 322. At time 330, the test system 200 measures the voltage 316 (measuring at the voltage value 322) using the voltmeter 210 and determines from the measured voltage value 322 that the FETs 112 and 114 have been put into the protective Hi-Z state, confirming correct operation of the OCP function of the FET device 100.

Figure 4:
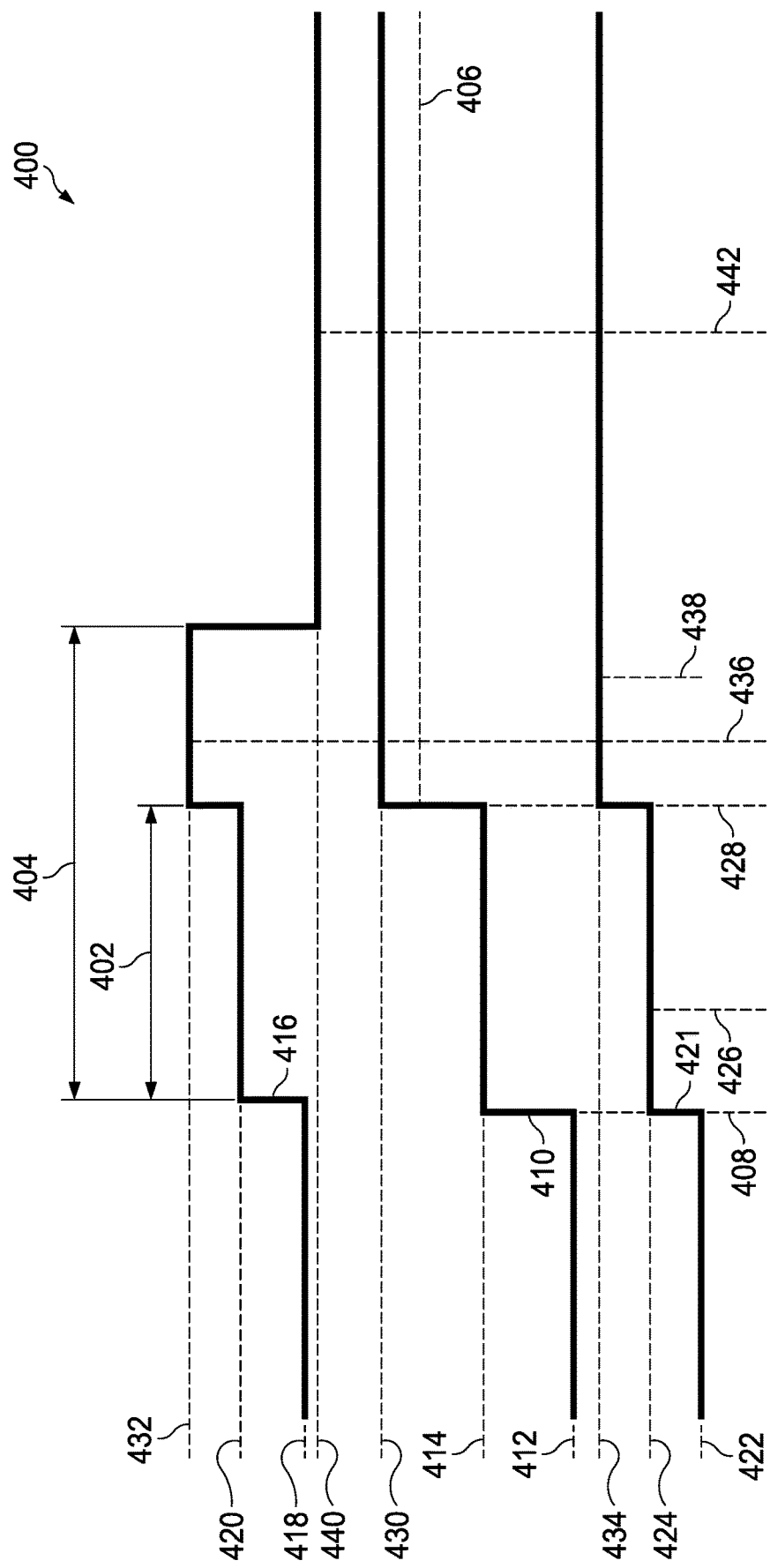
FIG. 4 shows a timing diagram for an FET device in accordance with various examples coupled in a first testing scenario.

FIG. 4 shows a timing diagram 400 for an FET device in accordance with various examples coupled in a second testing scenario. The timing diagram 400 is explained with reference to the FET device 100 coupled to a test system 200, as shown in FIG. 2. In response to the approximate 7 volt test mode signal on the digital input pin 124, the test mode sequencer 118 causes the current sense circuit 116 to increase the OCP deglitch period from a non-test mode period 402 used in non-test mode operation to a preset OCP deglitch test period 404 and to decrease the OCP current from a value used in non-test mode operation (not shown in FIG. 4) to a preset OCP test current 406. The test mode sequencer 118 also enables the current sense circuit 116. The test mode sequencer 118 also causes the gate driver circuit 110 to turn on the FETs 112 and 114

The preset OCP deglitch test period 404 is selected by a designer of the FET device 100 to be long enough for the test system 200 to measure both the current on the IPROPI output pin 128 from the FET device 100 and the RDS(on) parameter of the plurality of the FETs 112 and 114. In some examples, the preset OCP deglitch test period 404 is approximately 1 millisecond and the preset OCP test current 406 is approximately 4 amps.

The test system 200 begins the testing sequence at time 408 by raising the current 410 sinked from the OUT pin 120 by the controllable current source 206 from a current value 412 of approximately 0 amps to a first test current value 414. When the test system 200 begins sinking the first test current value 414, a voltage 416 across the FET 112, as measured by the voltmeter 210 (between terminals 120 and 122), rises from a voltage value 418 of approximately 0 volts to a voltage value 420. The voltage value 420 is a product of the first test current value 414 and the RDS(on) value of the plurality of the FETs 112 and 114.

Also, when the test system 200 begins sinking the first test current value 414, a current 421 on the IPROPI output pin 128 rises from a current value 422 of approximately 0 amps to a current value 424. The current value 424 on the IPROPI output pin 128 is proportional to the first test current value 414. At time 426, the test system 200 measures the current 421 (which has a current value 424) using the ammeter 204.

At time 428, the test system 200 raises the current 410 sinked from the OUT pin 120 from the first test current value 414 to a second test current value 430. In response, the voltage 416 across the FET 112 rises from the voltage value 420 to a voltage value 432. The voltage value 432 is a product of the current value 430 and the RDS(on) value of the FETs 112 and 114. Also in response, the current 421 on the IPROPI output pin 128 rises from the current value 424 to a current value 434. At time 436, the test system 200 measures the voltage value 432 of the voltage 416 across the FET 112 using the voltmeter 210. From the measured voltage value 432, the test system 200 calculates the RDS (on) value for the plurality of the FETs 112 and 114 to determine compliance of the FET device 100 with specifications.

At time 438, the test system 200 measures the current value 434 on the IPROPI output pin 128 using the ammeter 204. The test system compares the measured current values 424 and 434 to the first and second test current values 414 and 430, respectively, to determine whether a proportionality constant of the IPROPI signal of the FET device 100 is in compliance with specifications.

At the completion of the preset OCP deglitch test period 404, because the second test current value 430 is higher than the preset OCP test current 406, the current sense circuit 116 triggers its OCP function and causes the FETs 112 and 114 to be put into the protective Hi-Z state, dropping the voltage 416 across the FET 112 to a voltage value 440 of approximately −0.7 volts. At time 442, the test system 200 measures the voltage across the FET 112 using the voltmeter 210 and determines from the voltage value 440 that the FETs 112 and 114 have been put into the protective Hi-Z state, confirming correct operation of the OCP function of the current sense circuit 116.

The time 428 is shown in FIG. 4 as coinciding with the end of the non-test mode OCP deglitch period 402, however the time 428 is determined by the test system 200. The preset OCP deglitch test period 404 is selected by the designer of the FET device 100 to be long enough for the test system 200 to make the IPROPI measurements at times 426 and 438 and the RDS(on) measurement at time 436 in a single test period, providing a reduced overall testing time for the FET device 100.

Figure 5:
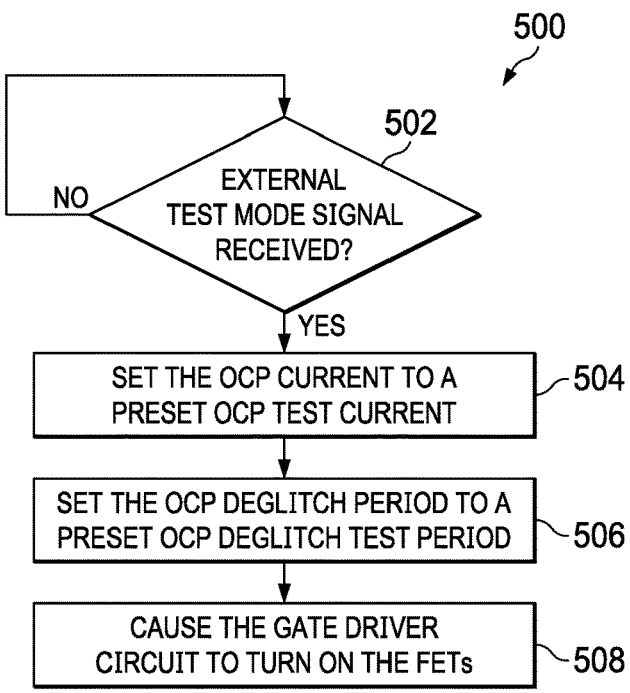
FIG. 5 shows a flow chart of a method for a test sequencer in accordance with various examples.

FIG. 5 shows a flow chart of a method 500 for a test mode sequencer in accordance with various examples. The method 500 is described with reference to the FET device 100 of FIG. 1. In step 502, the test mode sequencer 118 determines that an external test mode signal has been received on digital input pin 126. In response, in step 504 the test mode sequencer 118 sets the OCP current of the current sense circuit 116 to a preset OCP test current (e.g., preset OCP test current 306, 406). In step 506, the test mode sequencer 118 sets the OCP deglitch period of the current sense circuit 116 to a preset OCP deglitch test period (e.g., preset OCP deglitch test period 304, 404) and enables the current sense circuit 116. In step 508, the test mode sequencer 118 causes the gate driver circuit 110 to turn on the FETs 112 and 114.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description.

What is claimed is:

1. A device, comprising:
    a plurality of field-effect transistors (FETs), each of the FETs having a control terminal;
    a gate driver circuit coupled to the control terminal of each of the plurality of FETs and configured to:
        cause the plurality of FETs to turn on; and
        cause the plurality of FETs to enter a high-impedance state in response to receiving an over-current protection (OCP) signal;
    a current sense circuit coupled to the plurality of FETs and configured to sense an FET current passing through the plurality of FETs and to send the OCP signal to the gate driver circuit when the FET current exceeds an OCP current for a period of time longer than an OCP deglitch period; and
    a test sequencer coupled to the gate driver circuit and the current sense circuit, the test sequencer configured to, in response to receiving an external test mode signal:
        set the OCP current to a preset OCP test current;
        set the OCP deglitch period to a preset OCP deglitch test period; and
        cause the gate driver circuit to turn on the plurality of FETs.

2. The device of claim 1, wherein the current sense circuit is coupled to an output pin of the device and configured to produce an IPROPI signal on the output pin, the IPROPI signal proportional to the FET current.

3. The device of claim 2, wherein the IPROPI signal is a current proportional to the FET current.

4. The device of claim 1, wherein the current sense circuit is configured to sense an FET current passing through the plurality of FETs using a current-sharing MOSFET coupled to the source, gate, and drain of a first FET of the plurality of FETS.

5. The device of claim 1, wherein the external test mode signal comprises a voltage applied to a digital input pin of the device, the voltage exceeding a preset test mode threshold value.

6. The device of claim 5, wherein the preset test mode threshold value is five volts and the external test mode signal comprises a seven volt signal.

7. The device of claim 1, wherein the preset OCP test current is less than an OCP current used in non-test mode operation of the device.

8. The device of claim 7, wherein the preset OCP test current is one of 200 milliamps and 4 amps.

9. The device of claim 1, wherein the preset OCP deglitch test period is a value greater than an OCP deglitch period used in non-test mode operation of the device.

10. The device of claim 9, wherein the preset OCP deglitch test period is 1 millisecond.

11. A method of operating a field effect transistor (FET) device having at least one FET, comprising:
    receiving an external test mode signal and, in response thereto:
        setting an over-current protection (OCP) current of a current sense circuit of the FET device to a preset OCP test current;
        setting an OCP deglitch period of the current sense circuit to a preset OCP deglitch test period; and
        causing a gate driver circuit of the FET device to turn on one or more FETs of the FET device.

12. The method of claim 11, further comprising:
    sensing an FET current through the one or more FETs using a current-sharing MOSFET; and
    causing the one or more FETs to enter a high-impedance state in response to the FET current exceeding the OCP current for a period of time longer than the OCP deglitch period.

13. The method of claim 12, further comprising generating an IPROPI signal on an output pin of the FET device, the IPROPI signal proportional to the FET current.

14. The method of claim 13, wherein the IPROPI signal is a current proportional to the FET current.

15. The method of claim 11, wherein receiving the external test mode signal comprises sensing a voltage applied to a digital input pin of the FET device, where the voltage exceeds a preset test mode threshold value.

16. The method of claim 15, wherein the preset test mode threshold value is five volts and the external test mode signal comprises a seven volt signal.

17. The method of claim 11, wherein the preset OCP test current is less than an OCP current used in non-test mode operation of the FET device.

18. The method of claim 17, wherein the preset OCP test current is one of 200 milliamps and 4 amps.

19. The method of claim 11, wherein the preset OCP deglitch test period is a value greater than an OCP deglitch period used in non-test mode operation of the FET device.

20. The method of claim 19, wherein the preset OCP deglitch test period is 1 millisecond.

* * * * *